United States Patent
Nuessle (12)

(10) Patent No.: US 7,149,286 B2
(45) Date of Patent: Dec. 12, 2006

(54) ELECTRICAL SYSTEM LIKE A SYSTEM FOR TESTING THE CHANNELS OF A COMMUNICATION SYSTEM

(76) Inventor: Heinz Nuessle, Schafbergstrasse 12, 72108 Rottenburg (DE)

(*) Notice: Subject to any disclaimer, the term of this patent is extended or adjusted under 35 U.S.C. 154(b) by 394 days.

(21) Appl. No.: 10/304,513

(22) Filed: Nov. 26, 2002

(65) Prior Publication Data
US 2003/0189430 A1    Oct. 9, 2003

(30) Foreign Application Priority Data
Apr. 6, 2002  (EP) .................................. 02007780

(51) Int. Cl.
H04M 1/24 (2006.01)
H04M 3/08 (2006.01)
H04M 3/22 (2006.01)
H04M 1/00 (2006.01)
H04M 9/00 (2006.01)

(52) U.S. Cl. .............. 379/27.05; 379/412; 379/399.01; 379/1.01

(58) Field of Classification Search ............... 379/1.01, 379/9.06, 15.01, 16–17, 22.04, 399.01, 400–401, 379/412–413.01
See application file for complete search history.

(56) References Cited

U.S. PATENT DOCUMENTS

| | | | | |
|---|---|---|---|---|
| 3,890,559 A | * | 6/1975 | Kuster | 323/280 |
| 4,541,094 A | * | 9/1985 | Stiffler et al. | 714/53 |
| 4,947,427 A | * | 8/1990 | Rosch et al. | 379/412 |
| 5,909,591 A | * | 6/1999 | Brooke | 710/9 |
| 6,247,144 B1 | * | 6/2001 | Macias-Garza et al. | 714/25 |
| 2002/0118023 A1 | * | 8/2002 | Ewalt et al. | 324/539 |

FOREIGN PATENT DOCUMENTS

EP    0212045 A2    3/1987

OTHER PUBLICATIONS

Patent Abstracts of Japan document No. JP 11155233.

* cited by examiner

Primary Examiner—Quoc Tran
(74) Attorney, Agent, or Firm—Perman & Green, LLP

(57) ABSTRACT

An electrical system is described comprising none or one or two function boards and at least one voltage converter. The function board/s and the voltage converter are connected such that a voltage generated by the voltage converter is supplied to the function board/s. The electrical system comprises an electrical circuit for checking whether two function boards are present and whether these two function boards are identical, and for disabling the voltage converter under the condition that two non-identical function boards are present.

9 Claims, 3 Drawing Sheets

ELECTRICAL SYSTEM LIKE A SYSTEM FOR TESTING THE CHANNELS OF A COMMUNICATION SYSTEM

BACKGROUND OF THE INVENTION

1. Field of the Invention

The invention relates to an electrical system like a testing system for testing the channels of a communication system.

2. Brief Description of Related Developments

Such electrical system comprises two function boards and at least one voltage converter, wherein the function boards and the voltage converter are connected such that a voltage generated by the voltage converter is supplied to the function boards. In an electrical testing system, the function boards may be realized by so-called channel boards wherein none or one or two function boards may be plugged in and may therefore be present in the electrical system.

In such an electrical system, it is often required that, if two function boards are present, these two function boards are identical. If this requirement is not fulfilled, the function boards must not be supplied with a voltage.

SUMMARY OF THE INVENTION

It is therefore an object of the invention to provide an electrical system as described above with the ability to check whether two function boards are present and whether these two function boards are identical.

This object is solved by an electrical system according to claim 1.

In particular, the electrical system comprises an electrical circuit for checking whether two function boards are present and whether these two function boards are identical, and for disabling the voltage converter under the condition that two non-identical function boards are present.

The invention therefore provides an electrical system which automatically detects its own state. Under the condition that two function boards are present and that these two function boards are not identical, the electrical system ensures that the two function boards are not supplied with a voltage. In all other cases, i.e. if two identical function boards are present or if only one function board is present, the function board/s are/is supplied with a voltage.

The invention automatically avoids the risk that a supply voltage is forwarded to one of the function boards if the above requirement is not met. Thereby, it is ensured that the function boards are not damaged due to non-allowed conditions, in particular non-allowed voltages.

In an advantageous embodiment of the invention, the electrical system comprises a resistor on each one of the function boards wherein a specific value of the resistor unambiguously defines the corresponding function board. The invention, therefore, provides a resistor which is dedicated to each function board and which defines the function board. In particular, different resistors define different function boards. As a result, it is possible to detect the identity of the two function boards by comparing the values of the resistors of these two function boards.

It is advantageous if the electrical system comprises two serially connected transistors whose gates being connected to the two resistors of the two function boards, a first operational amplifier whose inputs are connected to the two resistors of the two function boards, and two further operational amplifiers being connected to the output of the first operational amplifier and establishing an upper and a lower threshold value.

BRIEF DESCRIPTION OF THE DRAWINGS

The invention together with further objects, advantages, features and aspects thereof will be more clearly understood from the following description taken in connection with the accompanying drawings.

DETAILED DESCRIPTION OF THE PREFERRED EMBODIMENT(S)

Figure 1:
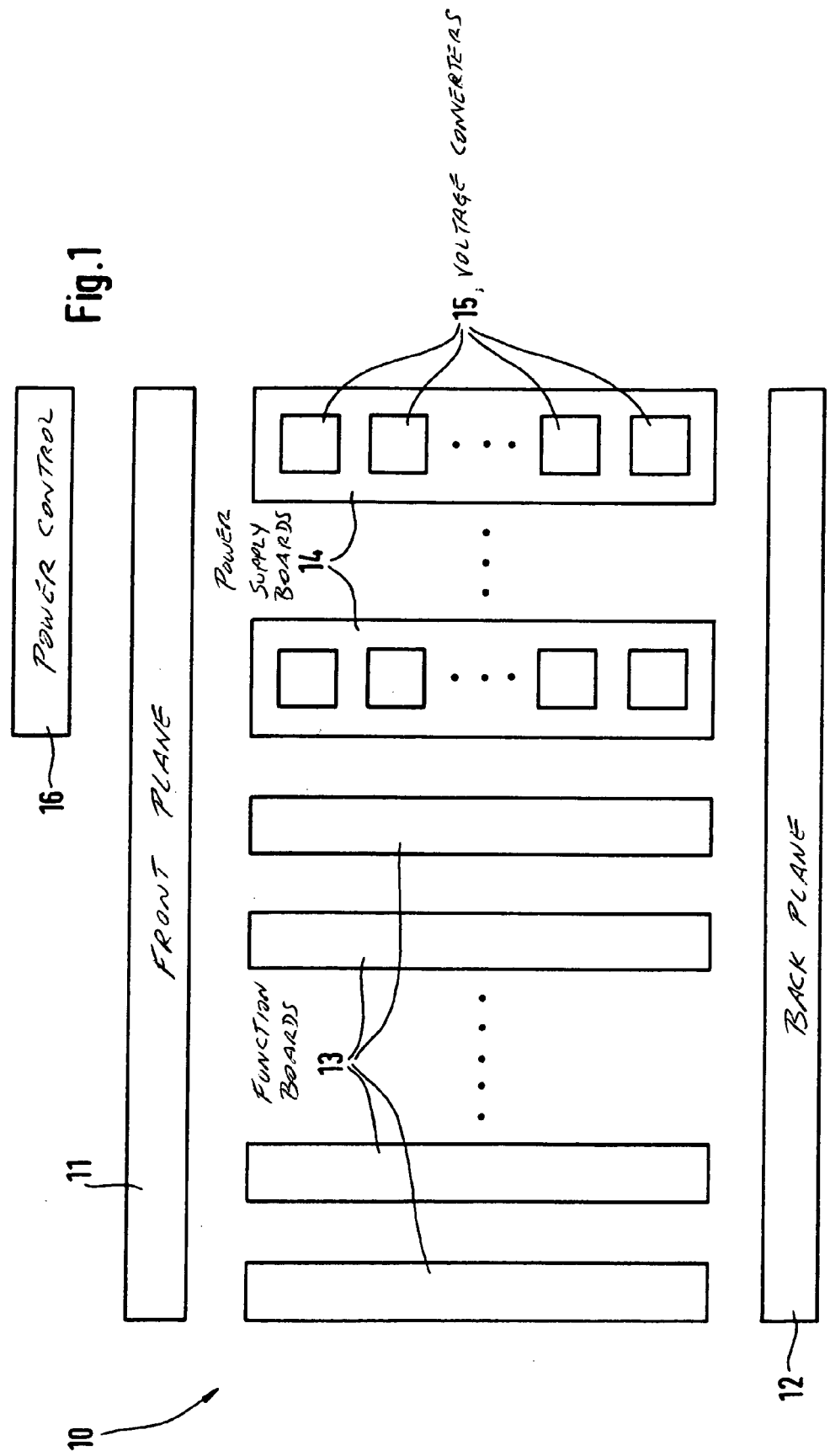
FIG. 1 is a schematic block diagram of an electrical system comprising one function board and at least one power supply board.

In FIG. 1, an electrical system 10 is shown, for example an electrical testing system for testing the channels of a communication system. The electrical system 10 is comprised in a rack or the like which provides a front plane board 11 and a back plane board 12. In between the front plane board 11 and the back plane board 12, a number of boards may be plugged into the rack. As shown in FIG. 1, the electrical system 10 is provided with a number of function boards 13 and a number of power supply boards 14. The function boards 13 may e.g. comprise the electrical circuits for testing the channels of the communication system. As an example, eight so-called channel boards may be present within the electrical system 10. The power supply boards 14 comprise the electrical circuits for creating the required voltages for the function boards. As an example, four such power supply boards 14 may be present within the electrical system 10.

Each one of the power supply boards 14 comprises a number of voltage converters 15 wherein each one of these voltage converters 15 is used to create on of the required voltages. As an example, five voltage converters 15 are present within each one of the power supply boards 14.

The front plane board 11 and the back plane board 12 comprise the connections between the function boards 13 and the power supply boards 14. As well, the front plane board 11 and the back plane board 12 provide grounds for the electrical circuits on the function boards 13 and the power supply boards 14, i.e. a front plane ground and a back plane ground.

Furthermore, a power control board 16 is connected to the front plane board 11 which comprises electrical circuits in particular for controlling the voltages created on the power supply boards 14.

Figure 2:
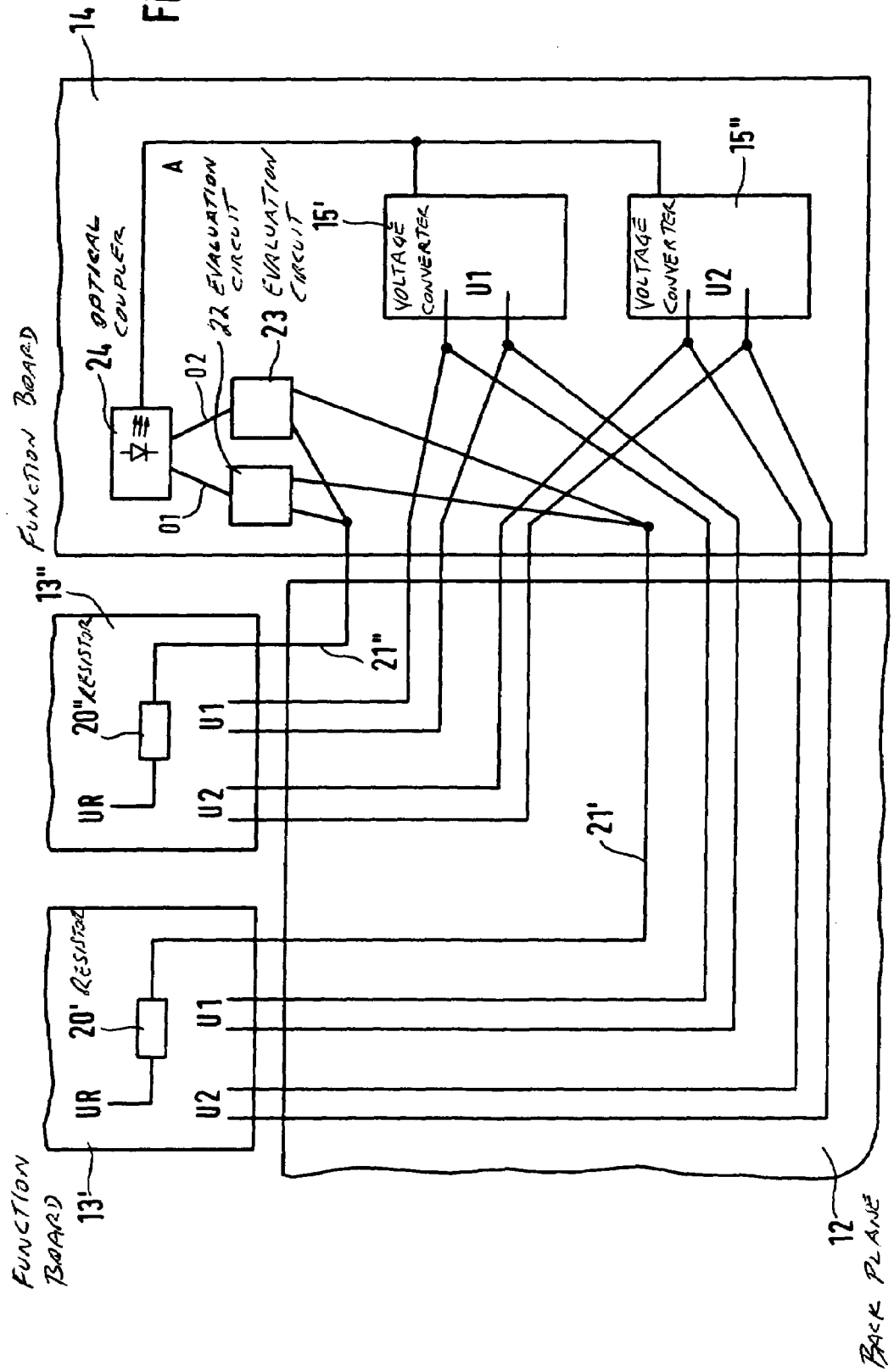
FIG. 2 is a more detailed schematic block diagram of the function boards and the power supply board of FIG. 1.

In FIG. 2, two function boards 13', 13", the back plane board 12 and one of the power supply boards 14 with two voltage converters 15', 15" are shown.

The voltage converter 15' creates a first voltage U1 and the voltage converter 15" creates a second voltage U2. The two voltages U1, U2 may be different or equal.

These two voltages U1, U2 are provided to each one of the two function boards 13', 13". The electrical connections between the voltage converters 15', 15" and the function boards 13', 13" are carried out via the back plane board 12.

In particular in an electrical testing system, it is often required that two channel boards are identical. If at least two channel boards are present, this requirement must be fulfilled. Otherwise, the channel boards must not be supplied with a voltage. If only one channel board is present, this requirement is not relevant and must not be fulfilled.

In order to check this requirement, the electrical system 10 of FIG. 1 comprises features as described below in connection with FIG. 2. It is mentioned that—although the two function boards 13', 13" are shown in FIG. 2—only one of them or even none of the two function boards 13', 13" may actually be present. This—unknown—state of the electrical system 10 is detected as described below.

As shown in FIG. 2, the function board 13' is provided with a first resistor 20' and the function board 13" is provided with a second resistor 20". Each one of the two resistors 20', 20" is supplied with a voltage UR, e.g.–12 V which may be taken e.g. from the back plane board 12.

The resistors 20', 20" identify the corresponding function board 13', 13". This means that a specific function board is provided with a specific value of its resistor wherein the specific value of the resistor unambiguously identifies the function board. If, therefore, the values of the two resistors 20', 20" of the two function boards 13', 13" are different, then the two function boards 13', 13" are different. If, however, the values of the two resistors 20', 20" of the two function boards 13', 13" are identical, then the two function boards 13', 13" are identical.

As shown in FIG. 2, each one of the two resistors 20', 20" is connected to the power supply board 14 via the back plane board 12. The respective connections are characterized by the reference numerals 21', 21".

On the power supply board 14, the two connections 21', 21" are connected to a first evaluation circuit 22 and to a second evaluation circuit 23, respectively. The two evaluation circuits 22, 23 are coupled via an optical coupler 24 as described later.

The first evaluation circuit 22 checks whether two resistors 20', 20" are present. The output signal O1 of the first evaluation circuit 22 is "conductive" if two resistors 20', 20" and therefore the two function boards 13', 13" are present. However, the output signal O1 of the first evaluation circuit 22 is "non-conductive" if only one or no resistor 20', 20" and therefore only one or none of the two function boards 13', 13" is present.

The second evaluation circuit 23 checks whether the two resistors 20', 20" are identical. The output signal O2 of the second evaluation circuit 23 is "high" if the two resistors 20', 20" and therefore the two function boards 13', 13" are identical. However, the output signal O2 of the second evaluation circuit 23 is "low" if the resistors 20', 20" and therefore the two function boards 13', 13" are not identical.

Figure 3:
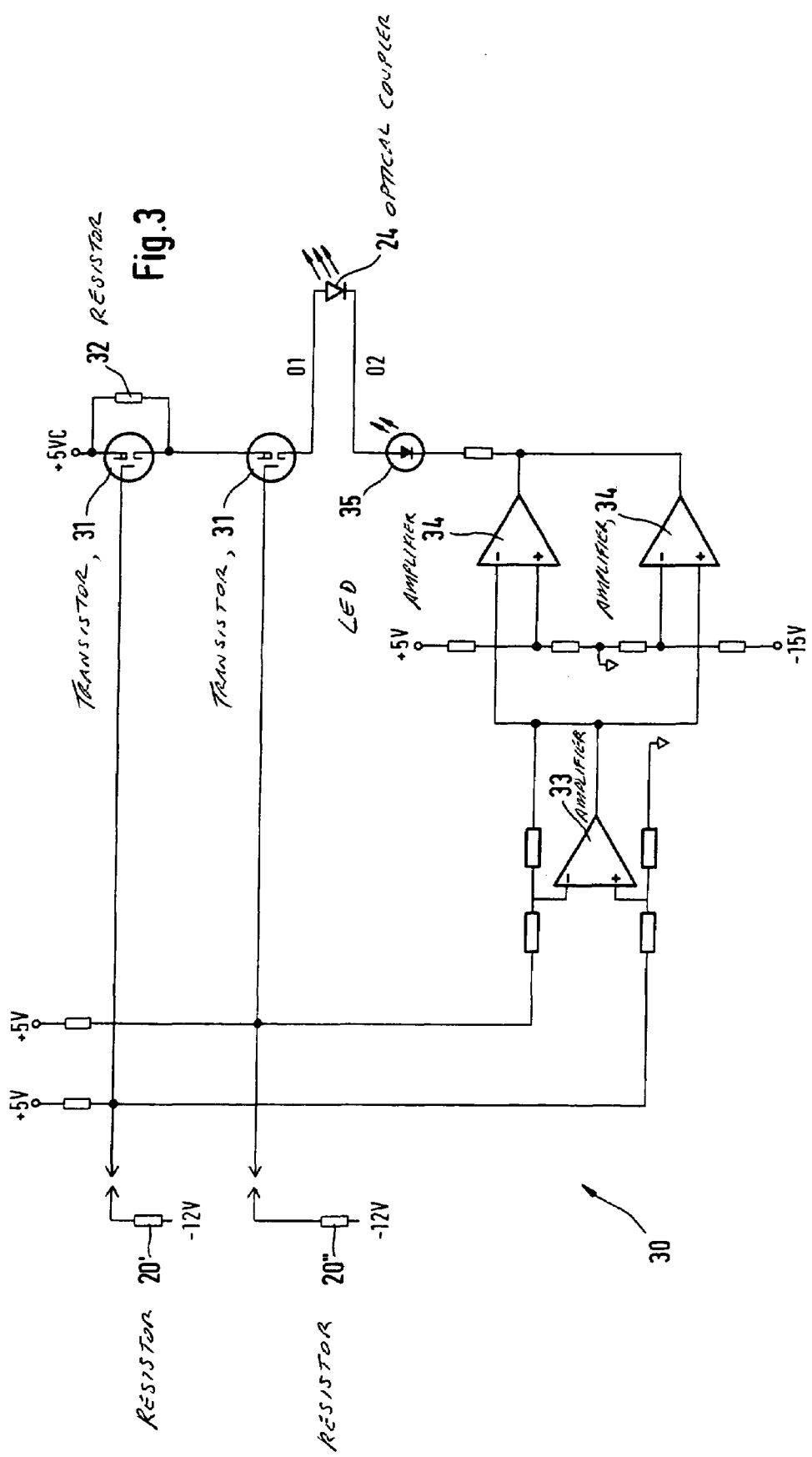
FIG. 3 is a schematic diagram of an electrical circuit comprised in the power supply board of FIG. 2.

In FIG. 3, an electrical circuit 30 is shown which realizes the first and the second evaluation circuits 22, 23 of FIG. 2.

The evaluation circuit 22 may be carried out e.g. with the help of two transistors 31 whose gates are connected to the resistors 20', 20", if present. The two transistors 31 are connected in series to a supply voltage wherein that transistor 31 which is not connected directly to the supply voltage, is coupled via a resistor 32 to the supply voltage.

Each one of the two transistors 31 is in its non-conducting state if the corresponding resistor 20', 20" is not present. As a result, the output signal O1 of the two transistors is "non-conductive". If only one of the two resistors 20', 20" is present, only one of the two transistors 31 is switched to its conducting state. However, due to the serial connection of the two transistors 31, the output signal O1 remains "non-conductive". Only if both resistors 20', 20" are present, then both transistors 31 are in their conducting state so that the output signal O1 becomes "conductive".

The evaluation circuit 23 may be carried out e.g. with the help of an operational amplifier 33 whose positive and negative inputs are connected to the two resistors 20', 20". The output of the operational amplifier 33 is connected to a comparator comprising two operational amplifiers 34. These operational amplifiers 34 are connected to a number of resistors so that an upper and a lower threshold value is defined by the two operational amplifiers 34 such that a zero voltage is in between these two threshold values.

If both resistors 20', 20" have the identical value, the output of the operational amplifier 33 is about a zero voltage. This zero voltage is detected by the two operational amplifiers 34 to be in between the two threshold values. Therefore, none of the two operational amplifiers 34 of the comparator creates an output voltage which corresponds to the output signal O2 to be "high". However, if the two resistors 20', 20" are different, the output of the operational amplifier 33 corresponds to a voltage which is outside of the two threshold values of the comparator which are defined by the two operational amplifiers 34. This has the result that one of the operational amplifiers 34 creates a negative output voltage which corresponds to the output signal O2 to be "low".

According to FIG. 3, the optical coupler 24 is connected in between the signals O1 and O2. Furthermore, a light emitting diode (LED) 35 is provided in this path. If the signal O1 is "conductive", a current could flow from the power supply to the optical coupler 24. However, this current can only flow if the signal O2 is "low". If this is the case, the current flows from the power supply to the LED 35 so that the LED 35 produces e.g. a red alarm light.

As a result, the LED 35 is turned on if two function boards 13', 13" are present (signal O1 is "conductive") and if the two function boards 13', 13" are not identical (signal O2 is "low"). Therefore, the LED 35 produces an alarm if the requirement of two identical function boards 13', 13" is not fulfilled.

If, however, two identical function boards 13', 13" are present, then the signal O2 is "high". The described current can therefore not flow via the optical coupler 24 and the LED 35. The LED 35 therefore does not show an alarm.

The same is valid if only one function board 13', 13" is present. In this case, the signal O1 is "non-conductive" so that no current can flow to the optical coupler 24 or the LED 35. Again, the LED 35 does not show an alarm.

As shown in FIG. 2, the output of the optical coupler 24 is connected to each one of the two voltage converters 15', 15".

As described, if two non-identical function boards 13', 13" are present, a current flows via the optical coupler 24 and the LED 35. In this case, the optical coupler 24 therefore creates an alarm signal A. This alarm signal A is provided to the two voltage converters 15', 15" so that these two voltage converters 15', 15" are disabled, i.e. turned off.

In all other cases, i.e. if two identical function boards 13', 13" are present or if only one function board 13', 13" is present, then no current flows via the optical coupler 24. Therefore, no alarm signal A is forwarded to the two voltage converters 15', 15". This results in the creation of the two voltages U1, U2 and the provision of these two voltages U1, U2 to the function boards 13', 13".

It shall be mentioned that the above described electrical system 10 may also comprise only a single voltage converter so that only a single voltage is provided to the two function boards. In this case, the alarm signal A of the optical coupler 24 is only connected to this single voltage converter.

What is claimed is:

1. A testing system for testing channels of a communication system, comprising:
   at least one voltage converter for supplying voltage to one or more function boards connected to one channel of the communication system;
   an electrical circuit for checking whether two function boards are present and whether these two function boards are identical, and for disabling the voltage converter under the condition that only two non-identical function boards are present, otherwise enabling the voltage converter.

2. The testing system of claim 1 comprising a resistor on each one of the function boards wherein a specific value of the resistor unambiguously defines the corresponding function board.

3. The testing system of claim 1 comprising a first evaluation circuit for checking whether two function boards are present and for creating an output signal.

4. The testing system of claim 2 comprising two serially connected transistors whose bases being connected to the two resistors of the two function boards.

5. The testing system of claim 1 comprising a second evaluating circuit for checking whether the two function boards are identical and for creating an output signal.

6. The testing system of claim 2 comprising a first operational amplifier whose inputs are connected to the two resistors of the two function boards, and comprising two further operational amplifiers being connected to the output of the first operational amplifier and establishing an upper and a lower threshold value.

7. The testing system of claims 3 comprising an alarm circuit, in particular an optical coupler for enabling or disabling the voltage converter depending on the two output signals.

8. The testing system of claims 5 comprising an alarm circuit, in particular an optical coupler for enabling or disabling the voltage converter depending on the two output signals.

9. The testing system of claim 1 wherein the function boards are so-called channel boards for testing the channels of a communication system.

* * * * *